United States Patent [19]

Mucke

[11] Patent Number: 5,231,364
[45] Date of Patent: Jul. 27, 1993

[54] PHASESHIFT NETWORK FOR AN IQ MODULATOR

[75] Inventor: Lars H. Mucke, San Diego, Calif.

[73] Assignee: Nokia Mobile Phones, Ltd., Helsinki, Finland

[21] Appl. No.: 903,359

[22] Filed: Jun. 24, 1992

[51] Int. Cl.[5] ........................ H04L 27/36; H03H 7/19; H03H 7/48
[52] U.S. Cl. ............................. 332/105; 333/124; 333/138; 375/39; 455/304
[58] Field of Search ............. 332/103, 104, 105, 119, 332/144, 146, 151, 152; 375/39; 455/304; 333/100, 124, 138

[56] References Cited

U.S. PATENT DOCUMENTS

| | | | |
|---|---|---|---|
| 3,891,980 | 6/1975 | Lewis et al. | 340/539 X |
| 4,200,849 | 4/1980 | Malocha | 333/194 |
| 4,737,968 | 4/1988 | Norton et al. | 332/103 X |
| 5,077,542 | 12/1991 | Lanoiselee | 332/151 |

Primary Examiner—Siegfried H. Grimm
Attorney, Agent, or Firm—Perman & Green

[57] ABSTRACT

A phaseshift network (2) exhibits approximately equal impedances to the outputs of an IQ mixer (10), over a range of modulation frequencies (Fm). The phaseshift network furthermore exhibits an approximately equal time delay for the I and Q modulated signals propagating therethrough. The phaseshift network includes a first branch having an input node for receiving a first frequency signal that varies within a range of frequencies about a frequency Fo. The first branch includes a phaseshifter for providing a frequency signal representative of the first input signal that is retarded by a first predetermined number of degrees. The phaseshift network further includes a second branch having an input node for receiving a second frequency signal that varies within a range of frequencies about the frequency Fo. The second branch includes a phaseshifter for providing a frequency signal representative of the second input signal that is advanced by a second predetermined number of degrees. A summer sums together the retarded and advanced frequency signals for providing, at an output node, an output signal that is a summation of the retarded and the advanced frequency signals.

20 Claims, 2 Drawing Sheets

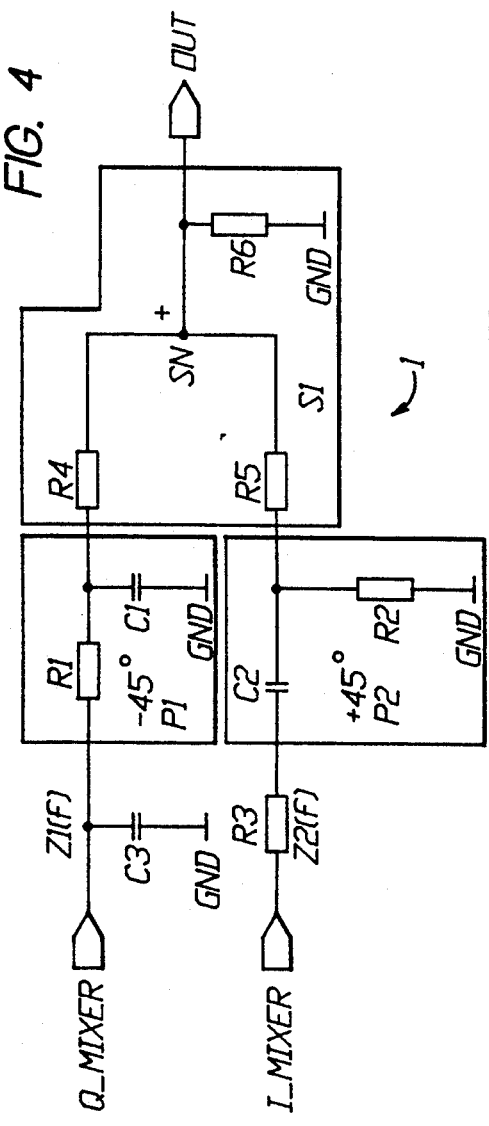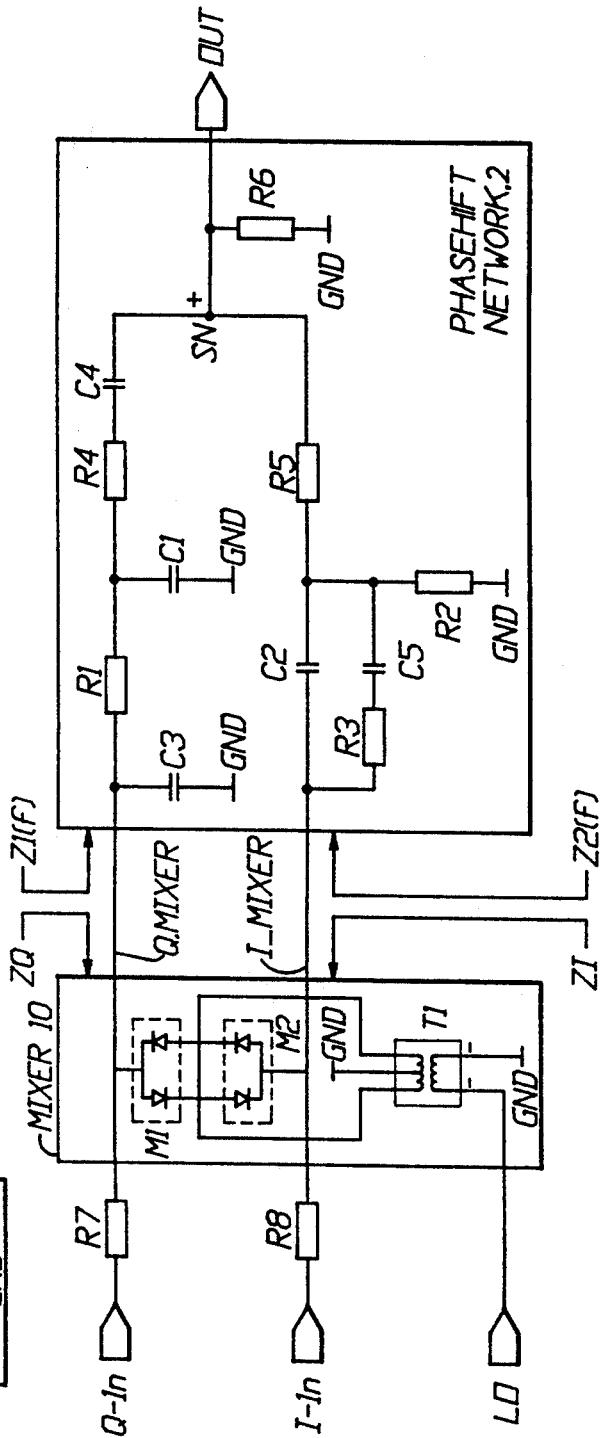

PHASESHIFT NETWORK FOR AN IQ MODULATOR

FIELD OF THE INVENTION

This invention relates generally to phaseshift circuits and, in particular, to phaseshift circuits for use with In-phase/Quadrature (IQ) modulators.

BACKGROUND OF THE INVENTION

Conventional implementations of IQ modulators are shown in FIGS. 1 and 2. M1 and M2 are two identical frequency multipliers, also referred to as frequency mixers. I and Q represent two input signals to be quadrature modulated. A summing device S1 sums the outputs of the I and Q circuit branches to generate an output signal (OUT).

In the circuit of FIG. 1, LO is a frequency signal that is generated by a Local Oscillator. LO is applied to a $-45°$ phaseshifter P1 and to a $+45°$ phaseshifter P2, and is thus phaseshifted by a total of 90°. The phaseshifted LO signal is mixed with Q-IN and with I-IN by mixers M1 and M2, respectively, resulting in, ideally, 90° of phaseshift between I and Q frequency components at the output of S1.

In the circuit configuration of FIG. 2 a single $-90°$ phaseshifter (P1') is interposed between LO and M1, and thus performs the same function as P1 and P2 in FIG. 1.

Although relatively straightforward to implement, the circuits of FIGS. 1 and 2 exhibit several problems. For example, both of these circuits require two separate mixers (M1 and M2) and, thus, require two separate balancing transformers in order to provide isolation between the LO signal and the I and Q signals. This is disadvantageous in that balancing transformers add significant cost and bulk to the circuitry. For consumer products, especially mobile communications products, it is generally desirable to minimize cost and size whenever possible.

It is known to employ transistor/FET mixers that do not require balancing transformers. However, transistor/FET mixers require bias potentials and DC power to operate. For battery powered systems, such as mobile communication systems, it is generally desirable to minimize circuit operating power so as to minimize battery recharging operations.

A further disadvantage of the circuits of FIGS. 1 and 2 is that the LO power must be sufficient to drive the phaseshifter(s), in addition to the mixers M1 and M2.

A still further disadvantage is that it is difficult to impedance match the outputs of the phaseshifters to the inputs of the mixers, in that the mixer input impedance is non-linear. As a result, the degree of phaseshift becomes a function of drive level.

It is thus an object of the invention to provide an IQ modulator that overcomes the foregoing problems.

It is another object of the invention to provide a low power, low cost phaseshifter circuit configuration that requires few components and no inductive components.

SUMMARY OF THE INVENTION

The foregoing and other problems are overcome and the objects of the invention are realized by a phaseshift network that includes a first branch having an input node for receiving a first frequency signal that varies within a range of frequencies about a frequency Fo. The first branch includes a phaseshifter for providing, at an output node of the first branch, a frequency signal representative of the first input signal that is retarded by a first predetermined number of degrees. The phaseshift network further includes a second branch having an input node for receiving a second frequency signal that varies within a range of frequencies about the frequency Fo. The second branch further includes a phaseshifter for providing, at an output node of the second branch, a frequency signal representative of the second input signal that is advanced by a second predetermined number of degrees. The phaseshift network also includes a summer, having a first input node coupled to the output node of the first branch and a second input node coupled to the output node of the second branch, for summing together the retarded and advanced frequency signals for providing, at an output node, an output signal that is a summation of the retarded and the advanced frequency signals.

In accordance with an aspect of the invention the second branch includes a resistance coupled in series between the input node and the phaseshifter for equalizing an insertion loss of the second branch to an insertion loss of the first branch. Furthermore, the first branch includes a capacitance coupled between the input node and a common potential for equalizing an input impedance of the first branch, at Fo, to an input impedance of the second branch, at Fo.

The summer includes a first resistance having a first terminal coupled to the output node of the first phaseshifter and a second terminal coupled to the output node of the summer, a second resistance having a first terminal coupled to the output node of the second phaseshifter and a second terminal coupled to the output node of the summer, and a third resistance having a first terminal coupled to the output node of the summer and a second terminal coupled to the common potential.

In accordance with a further aspect of the invention, the summer is further provided with a capacitance that is coupled in series between the second terminal of the first resistance and the output node of the summer for equalizing an input impedance of the first branch and the second branch over the range of frequencies that modulates Fo.

So as to equalize the delay time of the first and the second branches a resistance and a capacitance may be placed in parallel with the input of the second phaseshifter. The capacitance compensates for the presence of the capacitance provided in the summer.

BRIEF DESCRIPTION OF THE DRAWING

The above set forth and other features of the invention are made more apparent in the ensuing Detailed Description of the Invention when read in conjunction with the attached Drawing, wherein:

FIG. 4 is a schematic diagram illustrating a first embodiment of an IQ phaseshifter constructed in accordance with the invention; and FIG. 5 is a schematic diagram illustrating a second embodiment of an IQ phaseshifter constructed in accordance with the invention, the IQ phaseshifter being used in conjunction with a presently preferred embodiment of a single balanced mixer.

DETAILED DESCRIPTION OF THE INVENTION

Figure 3:
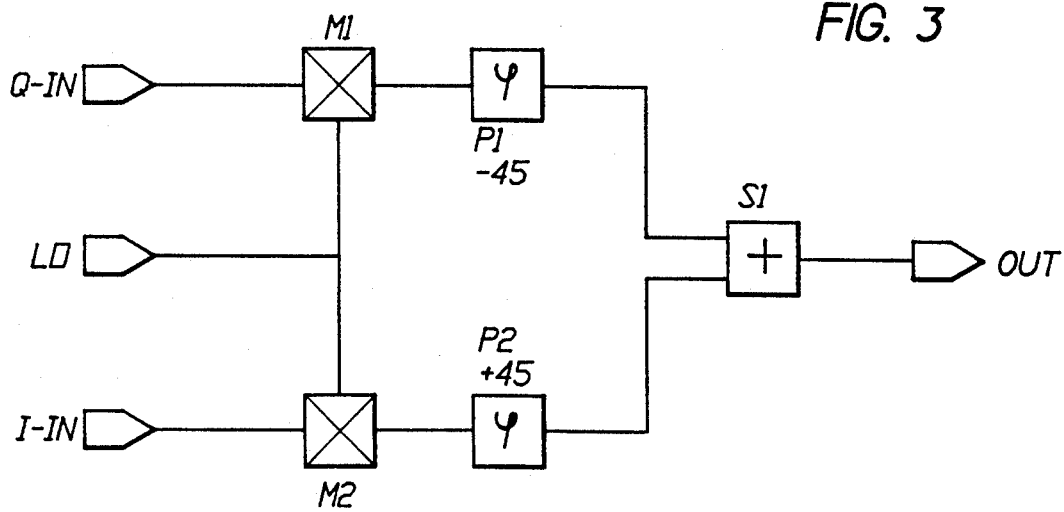
FIG. 3 is a block diagram illustrating a third IQ modulator/phaseshifter configuration.

Referring to FIG. 3 there is shown a block diagram of a third phaseshifter configuration for use with an IQ modulator. In this configuration, ±45° phaseshifters P1 and P2 are moved to the outputs of M1 and M2, respectively, and LO directly drives M1 and M2.

Figure 1:
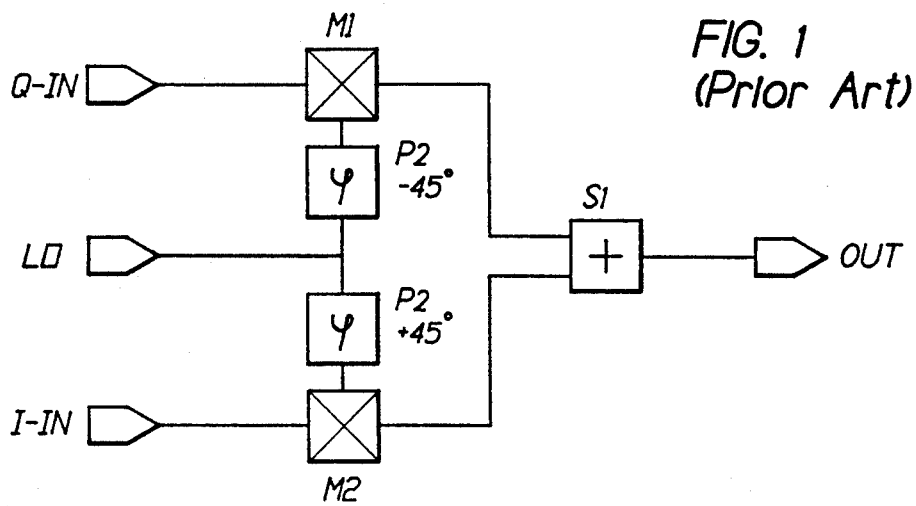
FIGS. 1 and 2 are each a block diagram illustrating a conventional IQ modulator/phaseshifter configuration of the prior art.
Figure 2:
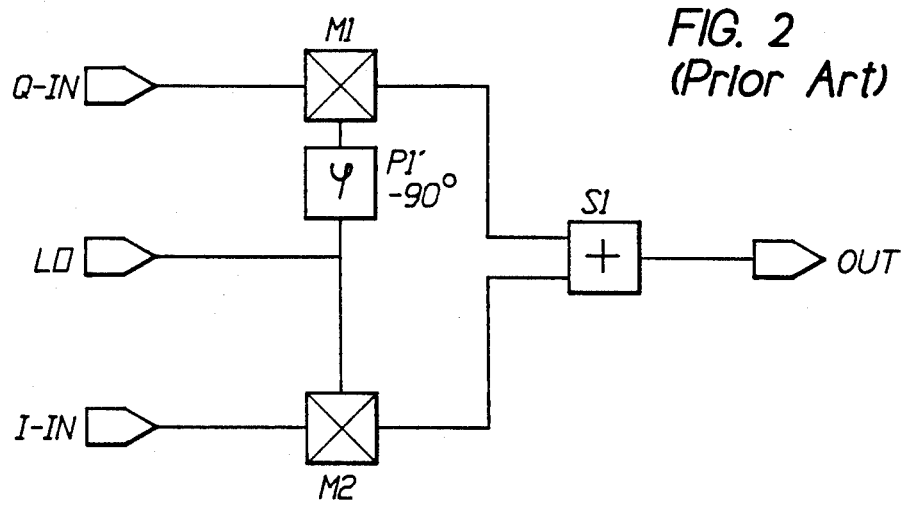

Advantages of this configuration include the following. First, the LO power can be reduced over the circuits of FIGS. 1 and 2, in that LO is required to drive only M1 and M2, and not P1 and P2, or P1'. Second, in that P1 and P2 are positioned at the outputs of M1 and M2, respectively, P1 and P2 do not experience the non-linear loading effect that is found at the inputs to the mixers.

It should be noted, however, that care must be taken to ensure that P1 and P2 not only phaseshift their respective input signals by 45°, but that they also delay their respective signals by the same amount of time. The latter requirement becomes more difficult to realize if the output bandwidth is wide compared to the center frequency.

FIGS. 4 and 5 are each a schematic diagram illustrating a first and a second embodiment of the invention, respectively. FIGS. 4 and 5 are specific, preferred implementations of the circuit configuration shown in FIG. 3. The various components are referenced to a circuit common potential shown as GND.

In FIG. 4, a phaseshift network 1 includes two phaseshift branches and a summer. Specifically, R1 and C1 implement a −45° phaseshift branch or network (P1) for an input signal Q_MIXER, and thus retard the signal Q_MIXER by 45°. R2, R3 and C2 implement a +45° phaseshift branch or network (P2) for an input signal I_MIXER, and thus advance the signal I_MIXER by 45°. Q_MIXER and I_MIXER are the output signals of M1 and M2, respectively, of FIG. 3. R4, R5, and R6 implement a summing circuit (S1), having a summing node (SN).

S1 provides isolation between the two summing inputs at the left terminals of R4 and R5 by providing a high insertion loss. That is, the ohmic value of R4 and R5 are each much larger than the ohmic value of R6. In that R4 loads P1, a same amount of insertion loss is required for P2. This is provided by R3 in series with the input to P2. Furthermore, due to the output impedances of M1 and M2, it is important that the loading impedances (Z1(Fo)) and (Z2(Fo)), as seen in FIG. 5, be approximately equal. So as to equalize the loading impedances, capacitor C3 is connected in parallel at the input to P1, and thus compensates the input impedance of P1 at Fo.

The MIXER 10 of FIG. 5 is a presently preferred mixer embodiment to generate the Q_MIXER and I_MIXER signals that are input to P1 and P2. MIXER 10 has a single balanced configuration. That is, the modulation input and output is not isolated. In the MIXER 10, M1 includes two diodes connected as shown to Q_in and M2 includes two diodes connected as shown to I_in. M1 and M2 are also each connected to a secondary of a balance transformer (T1). The primary of T1 is driven by the LO. As such, only one balance transformer is required, thus reducing the drive requirements of the LO, while still isolating LO from the I and Q inputs. R7 and R8 equally load the Q-in and the I-in signals at the input to the MIXER 10.

In that the MIXER 10 is single balanced, the input impedances Z1 and Z2 of P1 and P2, respectively, should be approximately equal and constant at the modulation frequency. That is, Z1 and Z2 should remain constant over the range of modulation frequencies (Fm) so as not to change the frequency response of the overall circuit.

In FIG. 4, Z1(Fm) is approximately equal to the series combination of R1+R4+R6. However, Z2(Fm) is approximately equal to the impedance of C2, and is thus larger than Z1(Fm). As a result, the insertion loss of the Q branch (P1) will be greater than the insertion loss of the I branch (P2). This unbalance can be compensated for by increasing the value of R3, but the total insertion loss of the phaseshift network will also become larger.

FIG. 5 is a schematic diagram of a presently preferred embodiment of the invention that overcomes the aforementioned imbalance of the input impedances of the Q and I branches of the phaseshift network.

Specifically, FIG. 5 shows a second phaseshift network 2 wherein a capacitance C4 is connected in series between R4 and the output summing node (SN) appearing at the top of R6. The impedance of C4 is significantly lower than R4 at Fo, and significantly higher than R4 at Fm. As a result, the loading of ZQ is governed by C1+C3+C4, and for ZI the loading is governed by C2. Thus, there is produced only a small delay difference between I and Q, and no significant insertion loss.

In that the required value of C4 is larger than the required value of C2, some finite delay difference exists between the I and Q phaseshifters. If it is desired to compensate for this residual small delay difference, the R3-C2-R2 network of FIG. 4 is transformed into the parallel network of FIG. 5, where R3 is placed in parallel with C2 and in series with a capacitance C5. The resulting circuit has the same properties as the configuration of FIG. 4, at Fo, and C5 compensates for the presence of C4 by providing an equal impedance at Fm.

As a result, there is produced a phaseshift network that exhibits approximately equal impedances to the mixer outputs, over the range of modulation frequencies, and that furthermore exhibits an approximately equal time delay for the modulated IQ signals propagating therethrough. Furthermore, the phaseshift network is constructed with only passive components, and does not require any inductive components. Only a relatively few total components are required, resulting in low cost and small size.

As an example of the construction of the embodiment of FIG. 5, for a case where Fo=90 MHz and Fm=1 KHz to 600 KHz, the following component values may be employed.

The various resistors have the following approximate ohmic values: R1=82, R2=47, R3=220, R4=220, R5=220, R6=25, R7=390, and R8=390. The capacitors have the following approximate values: C1=33 pF, C2=27 pF, C3=8.2 pF, C4=82 pF, and C5=82 pF.

While the invention has been particularly shown and described with respect to preferred embodiments thereof, it will be understood by those skilled in the art that changes in form and details may be made therein without departing from the scope and spirit of the invention. For example, the circuitry may be constructed so as to provide other than a total of 90° of phaseshift. Also, the phaseshifter may be employed with a mixer having other than the configuration shown. As such, the teaching of the invention is not intended to be limited to only the presently preferred embodiments described above, but is instead intended to be given a scope commensurate with the scope of the claims that follow.

What is claim is:

1. A phaseshift network, comprising:

a first branch having an input node for receiving a first frequency signal that varies within a range of frequencies about a frequency Fo and including means for providing, at an output node of said first branch, a frequency signal representative of the first input signal that is retarded by a first predetermined number of degrees;

a second branch having an input node for receiving a second frequency signal that varies within a range of frequencies about the frequency Fo and including means for providing, at an output node of said second branch, a frequency signal representative of the second input signal that is advanced by a second predetermined number of degrees; and summing means, having a first input node coupled to said output node of said first branch and a second input node coupled to said output node of said second branch, for summing together the retarded and advanced frequency signals and for providing at an output node an output signal that is a summation of the retarded and the advanced frequency signals; wherein said second branch includes first circuit means for equalizing an insertion loss of said second branch to an insertion loss of said first branch, and wherein said first branch includes second circuit means for equalizing an input impedance of said first branch, at Fo, to an input impedance of said second branch, at Fo.

2. A phaseshift network as set forth in claim 1 wherein:

said circuit means of said second branch includes a resistance coupled in series between said input node and said frequency signal providing means for equalizing the insertion loss of said second branch to the insertion loss of said first branch, and wherein said circuit means of said first branch includes a capacitance coupled between said input node and a common potential for equalizing the input impedance of said first branch, at Fo, to the input impedance of said second branch, at Fo.

3. A phaseshift network as set forth in claim 1 wherein said first predetermined number of degrees equals 45°, wherein said second predetermined number of degrees equals 45°, and wherein said output signal is representative of a 90° phaseshift between said first input signal and said second input signal.

4. A phaseshift network as set forth in claim 1 wherein said providing means of said first branch includes a resistance having a first terminal coupled to said input node, a second terminal coupled to said output node, and a capacitance having a first terminal coupled to said second terminal of said resistance and a second terminal coupled to the common potential, and wherein said providing means of said second branch includes a capacitance having a first terminal coupled to said input node, a second terminal coupled to said output node, and a resistance having a first terminal coupled to said second terminal of said capacitance and a second terminal coupled to the common potential.

5. A phaseshift network as set forth in claim 4 wherein said summing means includes a first resistance having a first terminal coupled to said output node of said first providing means and a second terminal coupled to said output node of said summing means, said summing means further including a second resistance having a first terminal coupled to said output node of said second providing means and a second terminal coupled to said output node of said summing means, said summing means further including a third resistance having a first terminal coupled to said output node of said summing means and a second terminal coupled to the common potential.

6. A phaseshift network as set forth in claim 5 wherein said summing means includes a capacitance coupled in series between said second terminal of said first resistance and said output node of said summing means for equalizing an input impedance of said first branch and said second branch over a range of frequencies that modulates Fo.

7. A phaseshift network as set forth in claim 1 wherein said input node of said first branch is coupled to a first output node of a single balanced mixer means, and wherein said input node of said second branch is coupled to a second output node of said single balanced mixer means.

8. A phaseshift network, comprising:

a first branch having an input node for receiving a first frequency signal that varies within a range about a frequency Fo and including means for providing, at an output node of said first branch, a frequency signal representative of the first input signal that is retarded by a first predetermined number of degrees;

a second branch having an input node for receiving a second frequency signal that varies within a range about the frequency Fo and including means for providing, at an output node of said second branch, a frequency signal representative of the second input signal that is advanced by a second predetermined number of degrees; and summing means, having a first input node coupled to said output node of said first branch and a second input node coupled to said output node of said second branch, for summing together the retarded and advanced frequency signals and for providing at an output node an output signal that is the summation of the retarded and the advanced frequency signals, said summing means including a first resistance having a first terminal coupled to said output node of said first providing means and a second terminal coupled to said output node of said summing means, said summing means further including a second resistance having a first terminal coupled to said output node of said second providing means and a second terminal coupled to said output node of said summing means, said summing means further including a third resistance having a first terminal coupled to said output node of said summing means and a second terminal coupled to a common potential; wherein said first branch includes a capacitance coupled between said input node and the common potential for equalizing an input impedance of said first branch, at Fo, to an input impedance of said second branch, at Fo; wherein said summing means includes a capacitance coupled in series between said second terminal of said first resistance and said output node of said summing means for equalizing an input impedance of said first branch and said second branch over the range of frequencies that modulates Fo; and wherein said second branch includes a resistance having a first terminal coupled to said input node and a second terminal coupled to a first terminal of a capacitance, said capacitance having a second terminal coupled to said output node of said second branch, said resistance equalizing an insertion loss of said second branch to an insertion loss of said first branch, and said capacitance equalizing a delay time between said first branch and said second branch by compensating for an effect of the capacitance of said summing means over the range of frequencies that modulates Fo.

9. A phaseshift network as set forth in claim 8 wherein said first predetermined number of degrees equal 45°, wherein said second predetermined number of degrees equals 45°, and wherein said output signal is representative of a 90° phaseshift between said first input signal and said second input signal.

10. A phaseshift network as set forth in claim 8 wherein said providing means of said first branch includes a resistance having a first terminal coupled to said input node, a second terminal coupled to said output node, and a capacitance having a first terminal coupled to said second terminal of said resistance and a second terminal coupled to the common potential, and wherein said providing means of said second branch includes a capacitance having a first terminal coupled to said input node, a second terminal coupled to said output node, and a resistance having a first terminal coupled to said second terminal of said capacitance and a second terminal coupled to the common potential.

11. A phaseshift network as set forth in claim 8 wherein said input node of said first branch is coupled to a first output node of a single balanced mixer means, and wherein said input node of said second branch is coupled to a second output node of said single balanced mixer means.

12. An IQ modulator, comprising:
single balanced mixer means having a first input for receiving a reference frequency signal Fo, a second input for receiving an in-phase modulation signal, and a third input for receiving a quadrature modulation signal, said mixer means having a first output providing a first frequency signal and a second output providing a second frequency signal;
a first branch having an input node coupled to said first output of said mixer means for receiving said first frequency signal, said first branch including means for providing, at an output node of said first branch, a first output frequency signal that is representative of the first frequency signal retarded by a first predetermined number of degrees;
a second branch having an input node coupled to said second output of said mixer means for receiving said second frequency signal, said second branch including means for providing, at an output node of said second branch, a second output frequency signal that is representative of the second frequency signal advanced by a second predetermined number of degrees; and
summing means, having a first input node coupled to said output node of said first branch and a second input node coupled to said output node of said second branch, for summing together the retarded and advanced frequency signals and for providing at an output node an output signal that is a summation of the retarded and the advanced frequency signals.

13. An IQ modulator as set forth in claim 12 wherein:
said second branch includes first circuit means for equalizing an insertion loss of said second branch to an insertion loss of said first branch, and wherein
said first branch includes second circuit means for equalizing an input impedance of said first branch, at Fo, to an input impedance of said second branch, at Fo.

14. An IQ modulator as set forth in claim 12 wherein said first predetermined number of degrees equals 45°, wherein said second predetermined number of degrees equals 45°.

15. A phaseshift network, comprising:
a first branch having an input node for receiving a first frequency signal that varies within a range of frequencies about a frequency Fo and including means for providing, at an output node of said first branch, a frequency signal representative of the first input signal that is retarded by a first predetermined number of degrees;
a second branch having an input node for receiving a second frequency signal that varies within a range of frequencies about the frequency Fo and including means for providing, at an output node of said second branch, a frequency signal representative of the second input signal that is advanced by a second predetermined number of degrees; and
summing means, having a first input node coupled to said output node of said first branch and a second input node coupled to said output node of said second branch, for summing together the retarded and advanced frequency signals and for providing at an output node an output signal that is a summation of the retarded and the advanced frequency signals;
wherein said input node of said first branch is coupled to a first output node of a single balanced mixer means, and wherein said input node of said second branch is coupled to a second output node of said single balanced mixer means.

16. A phaseshift network as set forth in claim 15 wherein: p1 said second branch includes a resistance coupled in series between said input node and said frequency signal providing means for equalizing an insertion loss of said second branch to an insertion loss of said first branch, and wherein
said first branch includes a capacitance coupled between said input node and a common potential for equalizing an input impedance of said first branch, at Fo, to an input impedance of said second branch, at Fo.

17. A phaseshift network as set forth in claim 15 wherein said first predetermined number of degrees equals 45°, wherein said second predetermined number of degrees equals 45°, and wherein said output signal is representative of a 90° phaseshift between said first input signal and said second input signal.

18. A phaseshift network as set forth in claim 15 wherein said providing means of said first branch includes a resistance having a first terminal coupled to said input node, a second terminal coupled to said output node, and a capacitance having a first terminal coupled to said second terminal of said resistance and a second terminal coupled to the common potential, and wherein said providing means of said second branch includes a capacitance having a first terminal coupled to said input node, a second terminal couple to said output node, and a resistance having a first terminal coupled to said second terminal of said capacitance and a second terminal coupled to the common potential.

19. A phaseshift network as set forth in claim 18 wherein said summing means includes a first resistance having a first terminal coupled to said output node of said first providing means and a second terminal coupled to said output node of said summing means, said summing means further including a second resistance having a first terminal coupled to said output node of said second providing means and a second terminal coupled to said output node of said summing means, said summing means further including a third resistance having a first terminal coupled to said output node of said summing means and a second terminal coupled to the common potential.

20. A phaseshift network as set forth in claim 19 wherein said summing means includes a capacitance coupled in series between said second terminal of said first resistance and said output node of said summing means for equalizing an input impedance of said first branch and said second branch over a range of frequencies that modulates Fo.

* * * * *